United States Patent [19]
Fujishima

[11] Patent Number: 5,981,996
[45] Date of Patent: Nov. 9, 1999

[54] VERTICAL TRENCH MISFET AND METHOD OF MANUFACTURING THE SAME

[75] Inventor: Naoto Fujishima, Nagano, Japan

[73] Assignee: Fuji Electric Co., Ltd., Japan

[21] Appl. No.: 08/602,150

[22] Filed: Feb. 15, 1996

[30] Foreign Application Priority Data

Feb. 17, 1995 [JP] Japan .................................. 7-029051

[51] Int. Cl.$^6$ ................................................. H01L 29/76
[52] U.S. Cl. ......................... 257/335; 257/330; 257/341
[58] Field of Search .................................. 257/335, 339, 257/341, 329, 330

[56] References Cited

U.S. PATENT DOCUMENTS

| | | | |
|---|---|---|---|
| 4,398,339 | 8/1983 | Blanchard et al. | 257/330 |
| 5,168,331 | 12/1992 | Yilmaz | 257/339 |
| 5,623,152 | 4/1997 | Majumdar et al. | 257/330 |
| 5,701,026 | 12/1997 | Fujishima et al. | 257/335 |

*Primary Examiner*—Mark V. Prenty
*Attorney, Agent, or Firm*—Rossi & Associates

[57] ABSTRACT

A vertical trench MISFET is provided that includes a semiconductor substrate having a first conductivity type semiconductor, and a second conductivity type impurity layer provided on the first conductivity type semiconductor. A trench extends from a surface of the semiconductor substrate to reach said first conductivity type semiconductor. A second conductivity type base region is formed in a top portion of the semiconductor substrate, and a first conductivity type source region is formed in a part of a surface layer of the second conductivity type base region. A first conductivity type drain drift region having a small thickness is formed in a surface layer of a side wall of the trench. The drain drift region has a higher impurity concentration than a level at which a breakdown voltage measured in a hypothetical diffusion type junction is substantially equal to an element withstand voltage. A gate electrode is formed on an exposed surface of the second conductivity type base region, through a gate insulating film. A source electrode is disposed in contact with surfaces of both of the first conductivity type source region and the second conductivity type base region, while a drain electrode is disposed in contact with a rear surface of the first conductivity type semiconductor.

10 Claims, 10 Drawing Sheets

5,981,996

VERTICAL TRENCH MISFET AND METHOD OF MANUFACTURING THE SAME

FIELD OF THE INVENTION

The present invention relates to a vertical MISFET (field-effect transistor of a metal-insulator-semiconductor structure) used in a power source incorporated in electronics, or a power source for driving motors, for example, wherein the MISFET has trenches, and exhibits a high withstand voltage and a low ON-state resistance. The present invention also relates to a method of manufacturing such a vertical MISFET as described above.

BACKGROUND OF THE INVENTION

Among various power semiconductor devices, a power MOSFET (field-effect transistor of a metal-oxide-semiconductor structure) as one kind of MISFET is known for a relatively low power loss and high-speed switching. The MOSFET, however, is desired to have a reduced ON-state resistance, since this element having a single kind of carriers (electrons or holes) performs no modulation of its conductivity by introducing minority carriers. On the other hand, a technique for forming trenches in a surface of a semiconductor element finds various applications, for example, to reduce the ON-state resistance of the semiconductor element. Thus, various structures of semiconductor elements having trenches have been proposed in recent years.

FIG. 7(a) is a cross sectional view showing a principal part of a conventional vertical MOSFET. This figure shows a unit cell of the MOSFET. In the actual MOSFET, this unit cell is repeatedly reversed with respect to the vertical line such that a multiplicity of unit cells are connected in series with each other. While this figure only shows an active region of the transistor assigned to perform switching of electric current, the actual semiconductor element needs to be provided with a peripheral portion which mainly contributes to withstanding voltage. The peripheral portion will not be described in detail since this portion is constructed in a normal form. In FIG. 7(a), an n drain drift region 702 in the form of an n epitaxial layer is superposed on an n$^+$ substrate 701, to provide a semiconductor substrate. A p base region 703 is formed in a selected area of a surface layer of the semiconductor substrate, and an n$^+$ source region 704 is formed in a part of a surface layer of the p base region 703. A gate electrode 707 is formed, through a gate oxide film 706, on the surface of the p base region 703 interposed between exposed surface areas of the n$^+$ source region 704 and the n drain drift region 702. A source electrode 708 is formed in contact with both the n$^+$ source region 704 and the p base region 703, and a drain electrode 709 is formed on the rear surface of the n$^+$ substrate 701. In operation of this semiconductor element, when a positive voltage is applied to the gate electrode 707, an n-type inversion channel appears in a surface layer of the p base region 703 right below the gate electrode 707, whereby the n$^+$ source region 704 is conducted with the n drain drift region 702. When the transistor is in its OFF state in which the gate voltage is not higher than a threshold voltage, the n-type inversion channel does not appear in the surface of the p base region 703. In this state, therefore, the voltage applied to the transistor is carried by a depletion layer which expands over both sides of a pn junction between the p base region 703 and the n drain drift region 702.

In the power MOSFET, several millions of unit cells each having the structure of FIG. 7(a) are integrated within one chip, so as to reduce the ON-state resistance. The ON-state resistance per unit area (Ron*A) and the withstand voltage are used as parameters for evaluating the performance of the power MOSFET. Where the withstand voltage is constant, the size of the chip is reduced with reduction of the ON-state resistance (Ron*A), so that the transistor can be manufactured at a reduced cost.

FIG. 7(b) is a view explaining details of the ON-state resistance of the power MOSFET of FIG. 7(a). The ON-state resistance of this transistor is a sum of a contact resistance (Rcnt) at an interface between the source electrode 708 and the n$^+$ source region 704, a channel resistance (Rch) in the channel formed in the surface layer of the p base layer right below the gate electrode 707, a JFET resistance (Rjfet) caused by narrowing of a current path due to the depletion layer, and a resistance (Rdrift) in the n drain drift region 702.

In particular, the specific resistance and thickness of the n drain drift region 702 are important parameters for determining the withstand voltage of the element and the resistance (Rdrift) of the drift region 702. In the structure shown in FIG. 7(a), the optimum specific resistance and thickness of the n drain drift region 702 are determined depending upon the required level of the withstand voltage of the element, as described in A. S. Grove: Physics and Technology of Semiconductor Devices, John Wiley & Sons, p.197, FIG. 6.31, for example. Where the element is required to have a withstand voltage of 60 V, the specific resistance and thickness of the n drain drift region 702 are 0.8 Ω·cm and 6.5 $\mu$m, respectively, and an effective thickness of the n epitaxial layer (Weff) that determines the withstand voltage is about 6 $\mu$m. The element withstand voltage, which is mainly determined by the structure as observed in the direction of depth of the element, is approximately equal to the withstand voltage of a diode including the p base region, n drain drift region 702 and the n$^+$ substrate 701 that are arranged in the depth direction of the element.

FIG. 8(a) is a cross sectional view showing a principal part of another conventional MOSFET. This figure, like FIG. 7(a), shows a unit cell of the MOSFET. In this unit cell, an n drain drift region (n epitaxial layer) 802 is laminated on an n$^+$ substrate 801, to provide a semiconductor substrate. A p base layer 803 is formed in a surface layer of the semiconductor substrate, and a trench 805 is formed from the surface of the p base layer 803 to reach the n drain drift region 802. An n$^+$ source region 804 is formed in a part of a surface layer of the p base layer 803. A gate electrode 807 is disposed in the trench 805, with a gate oxide film 806 interposed therebetween. A source electrode 808 is formed in contact with both the n$^+$ source region 804 and the p base region 803, and a drain electrode 809 is formed on the rear surface of the n$^+$ substrate 801. In operation of this element, when a positive voltage is applied to the gate electrode 807, an n type inversion channel appears in a surface layer of the p base layer 803 beside the gate electrode 807, whereby the n$^+$ source region 804 is conducted with the n drain drift region 802. When the transistor is in its OFF state in which the gate voltage is not higher than a threshold level, on the other hand, the inversion channel is not formed in the surface of the p base layer 803. In this state, the voltage applied to the transistor is carried by a depletion layer expanding over both sides of a pn junction between the p base layer 803 and the n drain drift region 802.

FIG. 8(b) is a view explaining details of the ON-state resistance of the power MOSFET of FIG. 8(a). The ON-state resistance of this transistor is a sum of a contact resistance (Rcnt) at an interface between the source electrode 808 and the n$^+$ source region 804, a channel resistance (Rch) in the channel formed in the surface layer of the p base layer 803 which faces the gate electrode 807, and a resistance (Rdrift) in the n drain drift region 802. Due to the absence of the resistance (Rjfet) in the MOSFET of FIG. 8(a) having the trench 805, the ON-state resistance of this MOSFET can be reduced as compared with that of the first conventional example of FIG. 7(a). Further, since the inversion channel is formed in the vertical direction of the MOSFET of FIG. 8(a), the density of cells integrated in one chip (element) can be increased, with a result of reduction of the ON-state resistance, as compared with the first conventional example of FIG. 7(a).

When the MOSFET of FIG. 8(a) is required to have a withstand voltage of 60 V, for example, the specific resistance of the n drain drift region 802 is 0.8 $\Omega\cdot$cm, and the thickness thereof is 6.5 $\mu$m, as in the first conventional example of FIG. 7(a). The effective thickness of the epitaxial layer (Weff) that determines the withstand voltage is about 6 $\mu$m.

In the structure of the first conventional example of FIG. 7(a), the size of the unit cell has been significantly reduced owing to a fine working or processing technique developed in recent years, and the resistances Rcnt, Rch and Rjfet of the resulting semiconductor element have been significantly reduced. At present, the ON-state resistance (Ron*A) of the power MOSFET having the withstand voltage of 60 V is 1.5 m $\Omega\cdot$cm$^2$, and the resistance (Rdrift) of the n drain drift region 702 amounts to about one third of the ON-state resistance, i.e., about 0.5 m$\Omega\cdot$cm$^2$. This resistance Rdrift, however, cannot be reduced due to the structure of the conventional element.

With respect to the structure of the second conventional example of FIG. 8(a), the ON-state resistance (Ron*A) is 1.0 m$\Omega\cdot$cm$^2$, and the resistance (Rdrift) of the n drain drift region 802 amounts to about a half of the ON-state resistance, i.e., about 0.5 $\Omega\cdot$cm$^2$.

Even with a further development of the fine working technique in the future, this resistance (Rdrift) of the epitaxial layer, that is, the n drain drift layer, will not be reduced as long as the power MOSFET has one of the conventional structures as described above.

SUMMARY OF THE INVENTION

It is therefore an object of the present invention to provide a power MOSFET having a reduced ON-state resistance, in particular, a reduced resistance (Rdrift) of its drift region. It is also an object of the invention to improve the temperature characteristic of the ON-state resistance of the element, and thus restrict an increase in the ON-state resistance at a high temperature.

The above objects may be accomplished according to a first aspect of the present invention, which provides a vertical trench MISFET comprising: a semiconductor substrate having a first conductivity type semiconductor, and a second conductivity type impurity layer disposed on the first conductivity type semiconductor; a trench extending from a surface of the semiconductor substrate to reach the first conductivity type semiconductor; a second conductivity type base region formed in a top portion of the semiconductor substrate; a first conductivity type source region formed in a part of a surface layer of the second conductivity type base region; a first conductivity type drain drift region formed in a surface layer of a side wall of the trench, the first conductivity type drain drift region having a small thickness, and a first impurity concentration that is higher than a second impurity concentration at which a breakdown voltage measured in a hypothetical diffusion type junction is substantially equal to an element withstand voltage; a gate electrode formed on an exposed surface of the second conductivity type base region; a gate insulating film provided between the gate electrode and the second conductivity type base region; a source electrode disposed in contact with surfaces of both of the first conductivity type source region and than second conductivity type base region; and a drain electrode disposed in contact with a rear surface of the first conductivity type semiconductor.

In the vertical trench MOSFET constructed according to the first aspect of the present invention, the first conductivity type drain drift region formed as a surface layer of the side wall of the trench has a relatively small thickness, and an impurity concentration that is higher than a level at which the breakdown voltage measured in a hypothetical diffusion type junction is almost equal to the withstand voltage of the element. Upon application of voltage lower than the element withstand voltage, therefore, a depletion layer fills the first conductivity type drain drift region and the second conductivity type region, whereby positive and negative fixed charges in these regions are balanced or offset, to thus reduce the electric field and achieve a high withstand voltage. Further, the ON-state resistance of the vertical trench MISFET can be reduced because of the high impurity concentration of the first conductivity type drain drift region.

With the impurity concentration of the first conductivity type drain drift region thus increased, the ON-state resistance of this drain drift region has a reduced temperature dependency, thus limiting an increase in the ON-state resistance of the element at a high temperature.

In one preferred form of the above aspect of the invention, the vertical trench MISFET comprises: a first conductivity type semiconductor; a second conductivity type impurity layer formed on a surface of the first conductivity type semiconductor; a second conductivity type base layer formed on the second conductivity type impurity layer and having a higher impurity concentration than the second conductivity type impurity layer; a first conductivity type source region formed in a part of a surface layer of the second conductivity type base layer; a trench extending from a surface of the first conductivity type source region to reach the first conductivity type semiconductor; a first conductivity type drain drift region formed in a surface layer of the second conductivity type impurity layer which is exposed to an inner surface of the trench, a gate electrode disposed in the trench such that the gate electrode faces a surface of the second conductivity type base layer which is exposed to the inner surface of the trench, a portion of the trench other than the gate electrode being filled with an oxide film; a gate insulating film provided between the gate electrode and the second conductivity type base layer; a source electrode disposed in contact with both of a surface of the first conductivity type source region and an exposed surface portion of the second conductivity type base region; and a drain electrode disposed in contact with a rear surface of the first conductivity type semiconductor.

In another preferred form of the first aspect of the invention, the vertical trench MISFET comprises: a first conductivity type semiconductor substrate; a second conductivity type impurity layer formed on a surface of the first conductivity type semiconductor substrate; a trench extending from a surface of the second conductivity type impurity layer to reach the first conductivity type semiconductor substrate; a first conductivity type side wall region formed in a surface layer of the second conductivity type impurity layer which is exposed to an inner surface of the trench; a second conductivity type base region formed in a surface layer of the second conductivity type impurity layer and a part of a surface layer of the first conductivity type side wall region; a first conductivity type source region formed in a part of a surface layer of the second conductivity type base region; a gate electrode formed on a surface of the second conductivity type base region which is interposed between the first conductivity type source region and the first conductivity type side wall region; a gate insulating film provided between the gate electrode and the second conductivity type base region; a source electrode disposed in contact with both of a surface of the first conductivity type source region and an exposed surface portion of the second conductivity type base region; a drain electrode disposed in contact with a rear surface of the first conductivity type semiconductor substrate; and an oxide film filling the trench.

In a further preferred form of the first aspect of the invention, the vertical trench MISFET comprises: a first conductivity type semiconductor substrate; a second conductivity type impurity layer formed on a surface of the first conductivity type semiconductor substrate; a first conductivity type impurity layer formed on the second conductivity type impurity layer; a second conductivity type base region formed in a part of a surface layer of the first conductivity type impurity layer; a first conductivity type source region formed in a part of a surface layer of the second conductivity type base region; a trench extending from a surface of the first conductivity type source region to reach the first conductivity type semiconductor substrate; a first conductivity type side wall region formed in a surface layer of the second conductivity type impurity layer which is exposed to an inner surface of the trench; a gate electrode formed on a surface of the second conductivity type base region which is interposed between the first conductivity type source region and the first conductivity type impurity layer; a gate insulating film provided between the gate electrode and the second conductivity type base region; a source electrode disposed in contact with surfaces of both of the second conductivity type base region and the first conductivity type source region, which surfaces are exposed to an inner surface of the trench; an oxide film filling a portion of the trench other than the source electrode; and a drain electrode disposed in contact with a rear surface of the first conductivity type semiconductor substrate.

The above-indicated objects may also be accomplished according to a second aspect of the present invention, which provides a vertical trench MISFET comprising: a semiconductor substrate having a first conductivity type semiconductor, and a first conductivity type impurity layer provided on the first conductivity type semiconductor, the first conductivity type impurity layer having a first impurity concentration that is higher than a second impurity concentration at which a breakdown voltage measured in a hypothetical diffusion type junction is substantially equal to an element withstand voltage; a trench extending from a surface of the semiconductor substrate to reach the first conductivity type semiconductor; a second conductivity type base region formed in a top portion of the semiconductor substrate; a first conductivity type source region formed in a part of a surface layer of the second conductivity type base region; a second conductivity type side wall region formed in a surface layer of a side wall of the trench; a gate electrode formed on an exposed surface of the second conductivity type base region, through a gate insulating film; a source electrode disposed in contact with surfaces of both of the first conductivity type source region and the second conductivity type base region; and a drain electrode disposed in contact with a rear surface of the first conductivity type semiconductor.

In the vertical trench MOSFET constructed according to the second aspect of the present invention, the second conductivity type side wall region is formed as a surface layer of the side wall of the trench, and the first conductivity type impurity layer has an impurity concentration that is higher than a level at which the breakdown voltage measured in a hypothetical diffusion type junction is substantially equal to the withstand voltage of the element. Upon application of voltage lower than the element withstand voltage, therefore, a depletion layer fills the first conductivity type impurity layer and the second conductivity type side wall region, whereby positive and negative fixed charges in these regions are balanced, to thus reduce the electric field and achieve a high withstand voltage. Further, the ON-state resistance of the vertical trench MISFET can be reduced because of the high impurity concentration of the first conductivity type impurity layer.

With the impurity concentration of the first conductivity type impurity layer thus increased, the ON-state resistance of this layer has a reduced temperature dependency, limiting an increase in the ON-state resistance of the element at a high temperature.

In one preferred form of the second aspect of the invention, the vertical trench MISFET comprises: a first conductivity type semiconductor; a first conductivity type drain drift layer formed on a surface of the first conductivity type semiconductor; a second conductivity type base layer formed on the first conductivity type drain drift layer; a first conductivity type source region formed in a part of a surface layer of the second conductivity type base layer; a trench extending from a surface of the first conductivity type source region to reach the first conductivity type semiconductor; a second conductivity type side wall region formed in a surface layer of a lower portion of the first conductivity type drain drift layer which is exposed to the inner surface of the trench; a gate electrode disposed in the trench such that the gate electrode faces a surface of an upper portion of the first conductivity type drain drift layer which is exposed to an inner surface of the trench, and a surface of the second conductivity type base layer which is exposed to the inner surface of the trench; a gate insulating film provided between the gate electrode, and the first conductivity type drain drift layer and the second conductivity type base layer; an oxide film filling a portion of the trench other than the gate electrode; a source electrode disposed in contact with both of a surface of the first conductivity source region, and an exposed surface portion of the second conductivity type base layer; and a drain electrode disposed in contact with a rear surface of the first conductivity type semiconductor.

In another preferred form of the second aspect of the invention, the vertical trench MISFET comprises: a first conductivity type semiconductor; a first conductivity type impurity layer formed on the first conductivity type semiconductor; a second conductivity type base region formed in a part of a surface layer of the first conductivity type impurity layer; a first conductivity type source region formed in a part of a surface layer of the second conductivity type base region; a trench extending from a surface of the first conductivity type impurity layer to reach the first conductivity type semiconductor; a second conductivity type side wall region formed in an exposed surface layer of the first conductivity type impurity layer which is exposed to an inner surface of the trench; a gate electrode formed on a surface of the second conductivity type base region which is interposed between the first conductivity type source region and the first conductivity type impurity layer; a gate insulating film provided between the gate electrode and the second conductivity type base region; a source electrode disposed in contact with both of a surface of the first conductivity type source region, and an exposed surface portion of the second conductivity type base region; a drain electrode disposed in contact with a rear surface of the first conductivity type semiconductor; and an oxide film filling the trench.

In a further preferred form of the second aspect of the invention, the vertical trench MISFET comprises: a first conductivity type semiconductor; a first conductivity type impurity layer formed on a surface of the first conductivity type semiconductor; a second conductivity type base region formed in a part of a surface layer of the first conductivity type impurity layer; a first conductivity type source region formed in a part of a surface layer of the second conductivity type base region; a trench extending from a surface of the first conductivity type source region to reach the first conductivity type semiconductor; a second conductivity type side wall region formed in a surface layer of the first conductivity type impurity layer which is exposed to an inner surface of the trench; a gate electrode formed on a surface of the second conductivity type base region interposed between the first conductivity type source region and the first conductivity type impurity layer; a gate insulating film provided between the gate electrode and the second conductivity type base region; a source electrode disposed in contact with both surfaces of the second conductivity type base region and the first conductivity type source region, which surfaces are exposed to the inner surface of the trench; an oxide film filling a portion of the trench other than the source electrode; and a drain electrode disposed in contact with a rear surface of the first conductivity type semiconductor.

In particular, the first conductivity type drain drift region or the second conductivity type side wall region, formed as a surface layer of the side wall of the trench, may consist of an impurity diffused layer. In this case, the region having a high impurity concentration can be easily formed.

The vertical trench MISFET as described just above may be manufactured such that ions are obliquely implanted into the side wall of the trench, which is then subjected to heat treatment, so as to form the first conductivity type drain drift region or the second conductivity type side wall region, as the surface layer of the side wall of the trench.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Referring to FIGS. 1 through 6, 9 and 10, there will be described some preferred embodiments of the present invention when applied to a MOSFET (field-effect transistor of a metal-oxide-semiconductor structure) having an element withstand voltage of 60 V. The present invention, however, is also applicable to a power MOSFET having an element withstand voltage of 30 to 1200 V and an output current of about 1 to 100 A.

Figure 1:
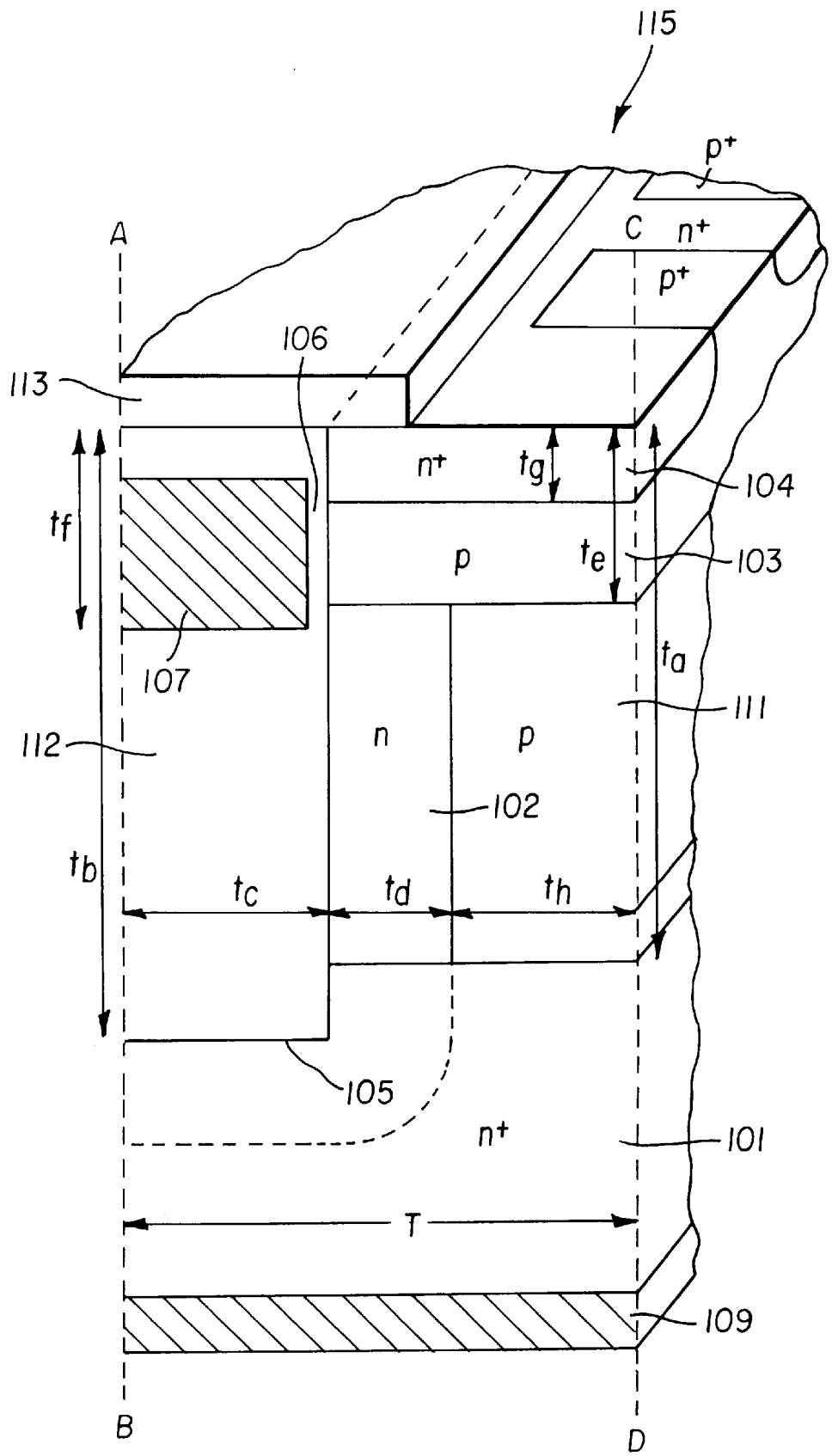
FIG. 1 is a perspective view in cross section, showing a principal part of a vertical trench MOSFET constructed according to the first embodiment of the present invention.

FIG. 1 is a perspective view in cross section, showing a principal part of a vertical MOSFET as the first embodiment of the present invention, from which a source electrode is removed. This figure shows a unit cell including half of a trench. In an actual semiconductor element, this unit cell is repeatedly reversed with respect to lines A-B and C-D so that a multiplicity of cells are connected in series with each other. While this figure only shows an active region of the transistor assigned to perform switching of electric current, the actual semiconductor element needs to be provided with a peripheral portion which mainly contributes to withstanding voltage. The peripheral portion will not be described in detail since this portion is constructed in a normal form.

Referring to FIG. 1, a p type impurity layer 111 having a specific resistance of 0.8 Ω·cm is laminated on an n$^+$ substrate 101 having a specific resistance of 1 mΩ·cm, to provide an epitaxial substrate, and a p base region 103 having a surface impurity concentration of $3.5 \times 10^{17}$ cm$^{-3}$ and a diffusion depth (te) of 3.0 μm is formed in a surface layer of the epitaxial substrate. Further, an n$^+$ source region 104 having a surface impurity concentration of $2.0 \times 10^{20}$ cm$^{-3}$ and a diffusion depth (tg) of 0.5 μm is formed in a part of the surface layer of the p base region 103. A trench 105 having a width (2×tc) of 1 μm and a depth (tb) of 9 μm is formed to extend from the surface of the epitaxial substrate, and an n drain drift region 102 having a surface impurity concentration of $1.1 \times 10^{17}$ cm$^{-3}$ and a diffusion depth (td) of 0.3 μm is formed in the inner surface of the trench 105. A lower portion of the trench 105 up to the depth (tf) of 2.5 μm is filled with an oxide film 112, and a gate electrode 107 formed of polycrystalline silicon is provided in an upper portion of the trench 105. This gate electrode 107 faces the side face of the p base region 103, through a 50 nm-thickness gate oxide film 106. A CVD oxide film 112 and an insulating film 113 are deposited on the gate electrode 107. Further, p$^+$ contact regions 110 having a high impurity concentration are formed in some parts of the uppermost surface of the semiconductor substrate in which the n$^+$ source region 104 is not formed. A source electrode 108 is formed in contact with both surfaces of the n$^+$ source region 104 and p$^+$ contact regions 110, and a drain electrode 109 is formed on the rear surface of the n⁺ substrate 101. The distance (T) between the line A-B and the line C-D, which is a half pitch of the unit cell of the MOSFET, is 2 μm, for example. In this case, "th" is 1.2 μm.

In operation of the MOSFET of the first embodiment of FIG. 1, when a voltage of not lower than a threshold level is applied to the gate electrode 107, while voltage is applied between the drain electrode 109 and the source electrode 108, an n-type inversion channel appears in a surface layer of the p base region 103 which faces the gate electrode 107, whereby the drain electrode 109 and the source electrode 108 are conducted with each other. In this state, electrons flow from the source electrode 108 to the drain electrode 109, through the n⁺ source region 104, the above-indicated channel, n drain drift region 102 and n⁺ substrate 101. When the transistor is in its OFF state, on the other hand, a depletion layer expands from pn junctions between the p base region 103 and the n drain drift region 102, between the n drain drift region 102 and the p type impurity layer 111, and between the p type impurity layer 111 and the n⁺ substrate 101. Thus, the depletion layer fills the n drain drift region 102 and the p type impurity layer 111, with a voltage lower than the element withstand voltage. Consequently, the positive and negative fixed charges in these region and layer 102, 111 are balanced or offset, to thus reduce the electric field and achieve a high withstand voltage. Since the n drain drift region 102 and p-type impurity layer 111 have sufficiently small thicknesses "td" and "th", which are in the range of 0.1 to 2.0 μm, these regions 102, 111 can be completely depleted even with a high impurity concentration of $10^{17}$ cm$^{-3}$ or more. This means that the ON-state resistance of the n drain drift region 102 in the unit cell can be reduced, while assuring a sufficiently high withstand voltage.

Figure 7A:
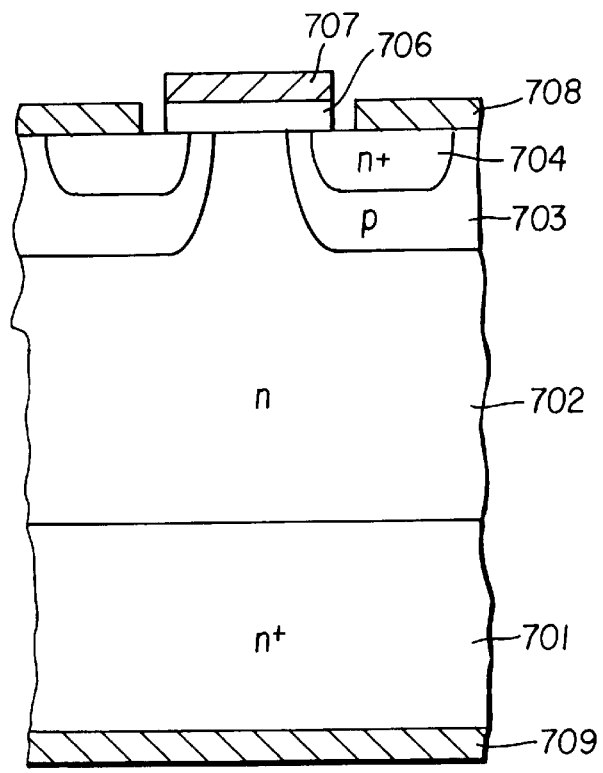
FIG. 7($a$) is a cross sectional view of a conventional vertical MOSFET, and FIG. 7($b$) is a view explaining details of the ON-state resistance of the MOSFET of FIG. 7($a$)
Figure 7B:
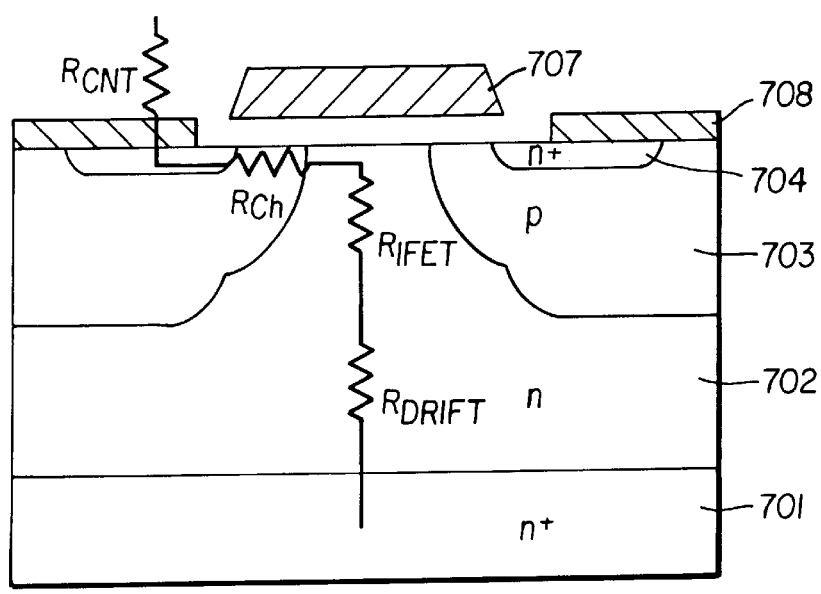
Figure 8A:
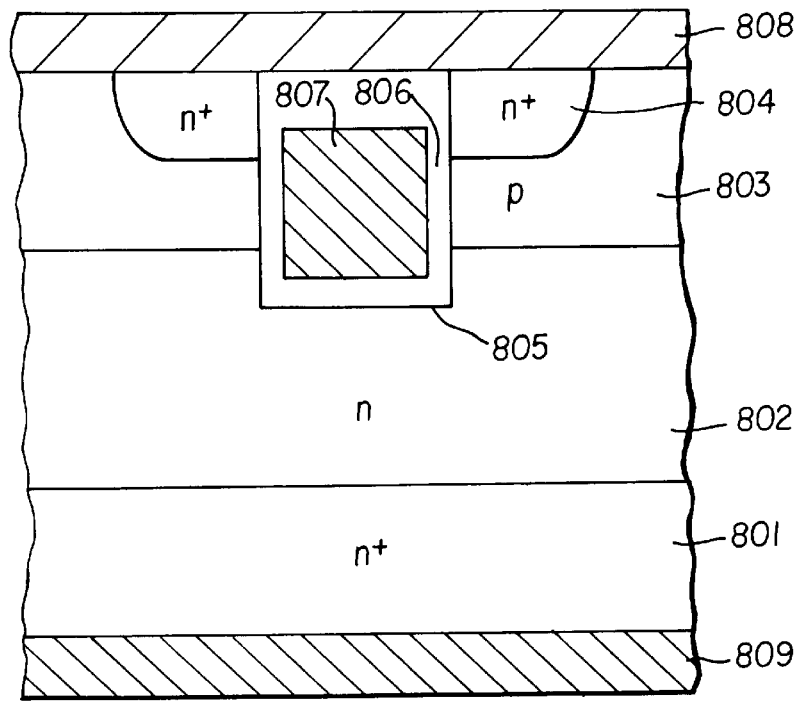
FIG. 8($a$) is a cross sectional view of a conventional vertical MOSFET, and FIG. 8($b$) is a view explaining details of the ON-state resistance of the MOSFET of FIG. 8($a$)
Figure 8B:
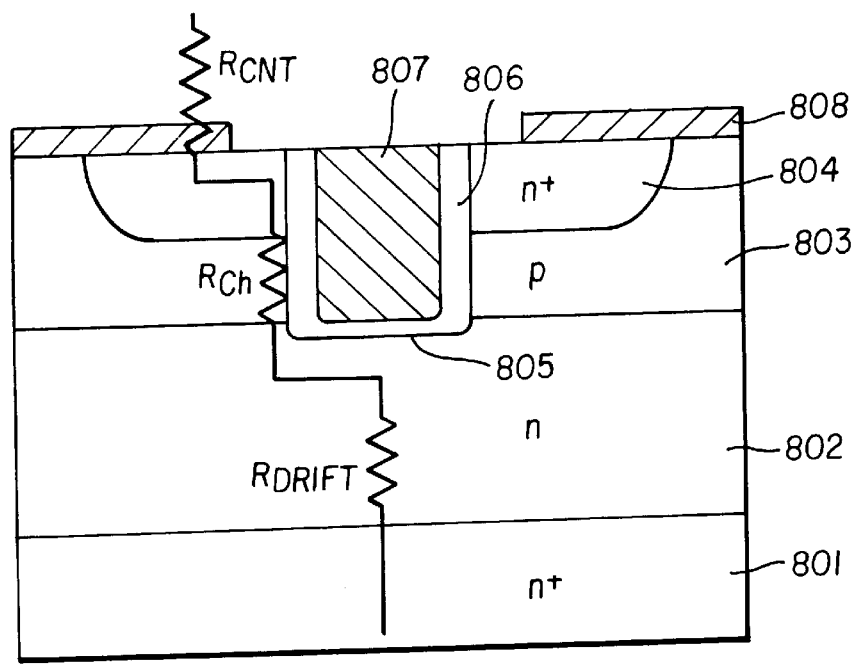

Assuming that the half pitch (T) of the unit cell is 2 μm in the first embodiment of FIG. 1 and in the known vertical MOSFET of FIGS. 7 and 8, the n drain drift region in the unit cell of the known examples has an electric charge of $1.4 \times 10^{12}$ cm$^{-2}$ where the specific resistance of the n drain drift region 702, 802 of the n epitaxial layer is 0.8 Ω·cm. This results in the ON-state resistance of 0.48 mΩ·cm². In the first embodiment of the present invention, the n drain drift region 102 has an electric charge of $1.6 \times 10^{12}$ cm$^{-2}$, and the resistance value (Rdrift) of this region can be thus reduced by about 12% down to 0.43 mΩ·cm².

When the size of the unit cell is reduced by reducing the trench width (2×tc) and the half pitch (T), the ON-state resistance of the n drain drift region can be significantly reduced in the first embodiment of the present invention, though reduction of the resistance (Rdrift) of the drift region cannot be expected in the known examples. If the trench width (2×tc) and the element pitch (T) of the unit cell of FIG. 1 are reduced to 0.5 μm and 1.5 μm, respectively, the electric charge of the n drain drift region 102 can be maintained at substantially the same value, i.e., $1.6 \times 10^{12}$ cm$^{-2}$, with a result of an increased density of cells in the integrated semiconductor chip. Consequently, the resistance (Rdrift) of the n drain drift region 102 is reduced down to 0.32 mΩ·cm². Thus, according to the present invention, the effect of reducing the resistance (Rdrift) becomes more notable with a further increase in the cell density of the semiconductor element. In the instant structure in which the p⁺ contact regions 110 are provided between the n⁺ source regions 104 in the direction of depth of the top portion 115, in particular, the width of the top portion 115 can be reduced, so as to increase the cell density of the integrated semiconductor chip.

The temperature characteristics of the known examples of MOSFET and the present embodiment will be described. The impurity concentration of the drain drift region of the known examples, when calculated on the basis of its specific resistance, i.e., 0.8 Ω·cm, is equal to $7.0 \times 10^{15}$ cm$^{-3}$. On the other hand, the maximum impurity concentration of the drain drift region of the present embodiment is about 10 times or higher than that of the known examples, as described above, providing the region having the impurity concentration of not less than $10^{17}$ cm$^{-3}$. It is generally known that the ON-state resistance of the semiconductor having a high impurity concentration has a relatively small degree of temperature dependency. Thus, the ON-state resistance of the whole element is expected to have an improved temperature characteristic. In the element having the conventional structure of FIG. 8, the ON-state resistance measured at 150° C. is about 2.2 times as that measured at room temperature, whereas the ON-state resistance of the element of the present invention, when measured at 150° C., is about 1.6 to 2 times of that measured at room temperature.

To achieve the same level of the ON-state resistance, the size of the semiconductor chip or element of the present invention can be reduced, as compared with that of the conventional examples, with a result of a reduced gate area, and reduced junction areas (where a p type region and an n type region are in contact with each other). Consequently, the parasitic capacity and the switching loss of the semiconductor element can be advantageously reduced.

Figure 9A:
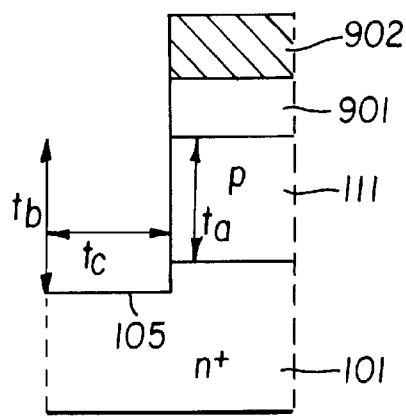
FIG. 9($a$) through FIG. 9($c$) are views showing process steps for manufacturing the vertical trench MOSFET of the first embodiment of FIG. 1.

FIGS. 9(a) through 9(c) and 10(a) through 10(c) are cross sectional views showing process steps of producing the vertical trench MOSFET of FIG. 1 as the first embodiment of the present invention. Referring first to FIG. 9(a), the p type impurity layer 111 having the specific resistance of 0.8 Ω·cm is epitaxially grown with a thickness of 8 μm (ta) on the n⁺ substrate 101 having the specific resistance of 1 mΩ·cm. Further, an oxide film 901 is formed on the p type impurity layer 111, and a photo resist 902 is deposited by coating on the oxide film 901, so as to form a pattern for the trench 105. Thereafter, the trench 105 is formed by anisotropic etching, more specifically, by a RIE (reactive ion etching) method, using a mixed gas of carbon tetrachloride and oxygen. The trench 105 thus formed has a depth (tb) of 9 μm and a width (2tc) of 1 μm.

Figure 9B:
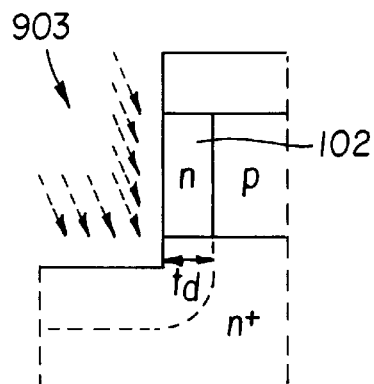

Thereafter, the n drain drift region 102 is formed by oblique ion implantation using arsenic ions 903, and heat treatment, as shown in FIG. 9(b). The n drain drift region or diffused layer 102 thus formed has a depth (td) of 0.3 μm, and a surface impurity concentration of $1.1 \times 10^{17}$ cm$^{-3}$.

Figure 9C:
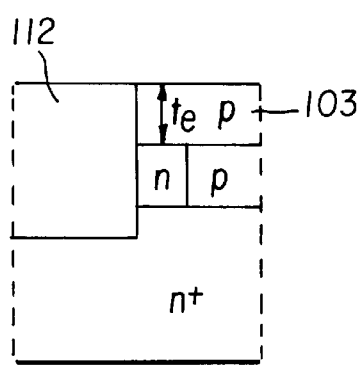

In the next step, a silicon oxide film is deposited by a vacuum CVD method, to fill the trench 105 with the oxide film 112. After the surface of the oxide film 112 is flattened, boron ions are implanted in the upper surface of the top portion 115 of the epitaxial substrate, so as to form the p base region 103 having a diffusion depth (td) of 2 μm, as shown in FIG. 9(c). The surface impurity concentration of this p base region 103 is about $3.5 \times 10^{17}$ cm$^{-3}$.

Figure 10A:
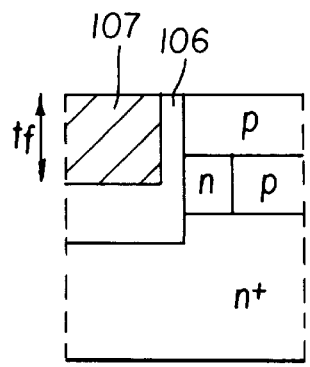
FIG. 10($a$) through FIG. 10($c$) are views showing subsequent process steps for manufacturing the vertical trench MOSFET of the first embodiment of FIG. 1.

Subsequently, the oxide film 112 in the trench 105 is etched to a depth (tf) of 2.5 μm, and a 50 nm-thickness gate oxide film 106 is formed by thermal oxidation on an exposed surface of the side wall of the p base region 103. Then, polycrystalline silicon is deposited by a vacuum CVD method on the oxide film 112, to fill a remaining space in the trench 105, and thus form the gate electrode 107 by patterning and etching, as shown in FIG. 10(a). The gate electrode 107 is connected to those of adjacent unit cells, outside the active regions, so as to constitute a gate electrode of the whole element.

Figure 10B:
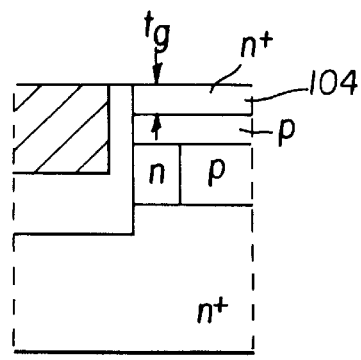

In the next step shown in FIG. 10(b), arsenic ions are implanted in the upper surface of the top portion 115, which is then subjected to heat treatment, so as to form the n+ source region 104. The diffused layer 104 thus formed has a depth (tg) of 0.5 μm, and a surface impurity concentration of $2.0 \times 10^{20}$ cm$^{-3}$. The maximum impurity concentration of the p base region 103 below the n+ source region, which determines the threshold value of the MOSFET, is $3.0 \times 10^{17}$ cm$^{-3}$. In this case, the threshold value is about 1 V. At the same time, some portions of the n+ source region 104 are removed by patterning, in the direction of depth of the region 104, and the p+ contact regions (not shown) are formed in these portions.

Figure 10C:
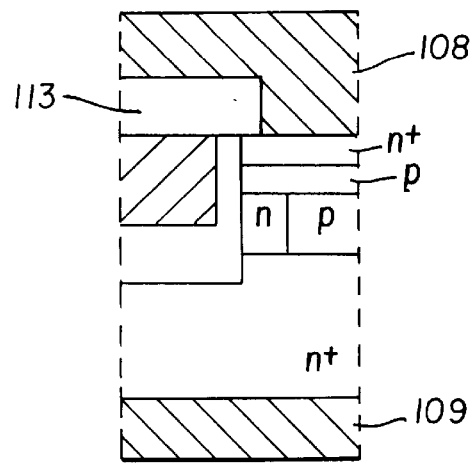

In the next step shown in FIG. 10(c), the insulating film 113 is formed, with a contact window formed therethrough, and the source electrode 108 is formed in contact with the n+ source region 104 and the p+ contact regions 110. Thereafter, a passivation process is effected, and the rear surface of the obtained wafer is ground to reduce its thickness. Finally, the drain electrode 109 is formed by a deposition method on the rear surface of the wafer.

FIGS. 2 through 6 show the second through sixth embodiments of the present invention. These embodiments are designed according to the same principle as the first embodiment.

Figure 2:
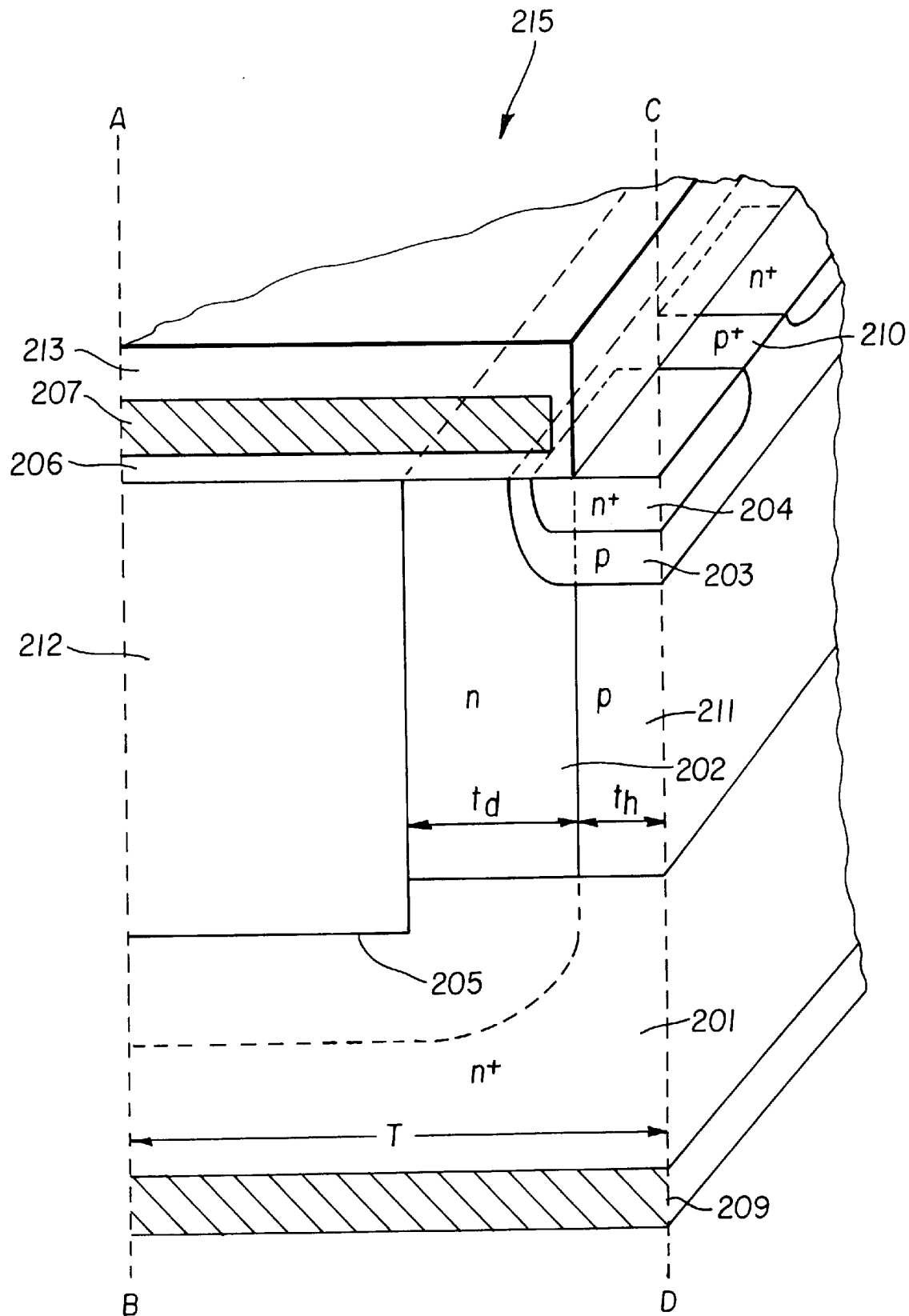
FIG. 2 is a perspective view in cross section, showing a principal part of a vertical trench MOSFET as the second embodiment of the present invention.

FIG. 2 is a perspective view in cross section, showing a principal part of a MOSFET as the second embodiment of the present invention, from which a source electrode is removed. In this embodiment, a p type impurity layer 211 is formed on an n+ substrate 201, by epitaxially growing a p type semiconductor layer on the substrate 201, to provide an epitaxial substrate. A trench 205 is then formed from the surface of the epitaxial substrate, and arsenic ions are obliquely implanted in the inner wall of the trench 205, which is then subjected to heat treatment, so as to form an n drain drift region 202. These features are identical with those of the first embodiment. The present embodiment is different from the first embodiment in that a p base region 203 is formed in a selected area of the upper surface layer of a top portion 215 that is left after formation of the trench 205, such that the p base region 203 is spaced a small distance apart from the edge of the trench 25, and is partially defined by the n drain drift region 202. Further, n+ source regions 204 are formed in a surface layer of the p base region 203. A gate electrode 207 made of polycrystalline silicon is formed on the surface of the p base region 203 interposed between the n+ source region 204 and the n drain drift region 202, through a gate oxide film 206. Further, p+ contact regions 210 having a relatively high impurity concentration are formed in portions of the surface layer of the p base region 203 in which the n+ source regions 204 are not formed. A source electrode is formed in contact with the surfaces of the n+ source regions 204 and the p+ contact regions 210, and a drain electrode 209 is formed on the rear surface of the n+ substrate 201. The distance (T) between the line A-B and the line C-D, which is a half pitch of a unit cell of this MOSFET, is 2 μm, for example. The trench 205 is filled with an oxide film 212, and the gate electrode 207 may be extended over the oxide film 212, as shown in FIG. 2.

In this second embodiment, too, a depletion layer fills the n drain drift region 202 and the p type impurity layer 211, upon application of a voltage lower than the element withstand voltage. As a result, the positive and negative fixed charges in these region and layer 202, 211 are balanced, to thus reduce the electric field and achieve a high withstand voltage. Since the thicknesses "td" and "th" of the n drain drift region 202 and p type impurity layer 211 are sufficiently small, these regions 202, 211 can be completely depleted even if they have a high impurity concentration of $10^{17}$ cm$^{-3}$ or more. This means that the ON-state resistance of the n drain drift region 202 in the unit cell can be reduced, while assuring a sufficiently high withstand voltage. Needless to say, this embodiment yields the same effects as the first embodiment of FIG. 1, with regard to the temperature dependency of the ON-state resistance and the switching loss. Further, the gate electrode 207 is formed not within the trench 205, but on the surface of the top portion 215, thus making it easy to manufacture the MOSFET of the second embodiment. Moreover, when the gate electrode 207 extends over the n drain drift region between the trench 205 and the p base region 203, as shown in FIG. 2, the expansion of the depletion layer is promoted due to a field plate effect upon application of voltage, assuring a further increased withstand voltage.

Figure 3:
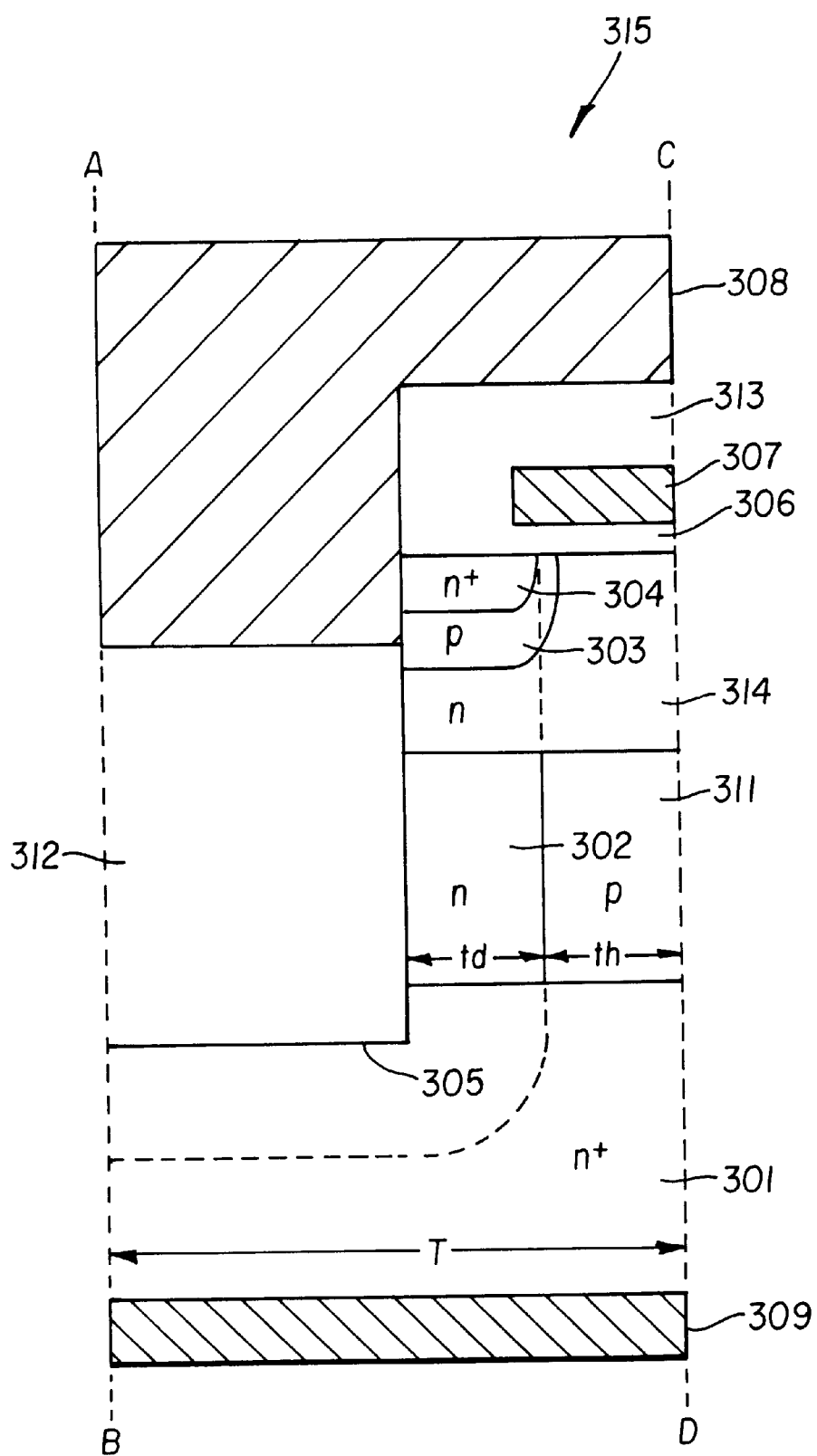
FIG. 3 is a perspective view in cross section, showing a principal part of a vertical trench MOSFET as the third embodiment of the present invention.

FIG. 3 is a cross sectional view showing a principal part of a MOSFET according to the third embodiment of the present invention. In this embodiment, a p type impurity layer 311 and an n type impurity layer 314 are formed on an n+ substrate 301, by epitaxially growing a p type semiconductor layer and an n type semiconductor layer on the substrate 301, to provide an epitaxial substrate. A p base region 303 is formed in a selected area of a surface layer of the epitaxial substrate, and an n+ source region 304 is formed in a surface layer of the p base region 303. A trench 305 is formed to extend from the surface of the n+ source region 304 into the n+ substrate 301. To form an n drain drift region 302, arsenic ions are obliquely implanted in the lower portion of the inner wall of the trench 305, which is then subjected to heat treatment. A gate electrode 307 made of polycrystalline silicon is formed on the surface of the p base region 303 interposed between the n+ source region 304 and the n type impurity layer 314, through a gate oxide film 306. A source electrode 308 is formed in contact with the surfaces of the n+ source region 304 and p base region 303 which are exposed to the inner wall of the trench 305, and a drain electrode 309 is formed on the rear surface of the n+ substrate 301. The upper and side portions of the gate electrode 307 are covered with an insulating film 313, such as PSG, and is thus insulated from the source electrode 308. The distance (T) between the line A-B and the line C-D, which is a half pitch of a unit cell of this MOSFET, is 2 μm, for example. The trench 305 is filled with an oxide film 312.

In this third embodiment, too, a depletion layer fills the n drain drift region 302 and the p type impurity layer 311, upon application of a voltage lower than the element withstand voltage. As a result, the positive and negative fixed charges in these region and layer 302, 311 are balanced, to thus reduce the electric field and achieve a high withstand voltage. Since the thicknesses "td" and "th" of the n drain drift region 302 and p type impurity layer 311 are sufficiently small, these regions 302, 311 can be completely depleted even if they have a high impurity concentration of $10^{17}$ cm$^{-3}$ or more. This means that the ON-state resistance of the n drain drift region 302 in the unit cell can be reduced, while assuring a sufficiently high withstand voltage.

In the third embodiment of FIG. 3, in particular, the contact of the source electrode 308 with the n+ source region 304 is made on the inner surface of the trench 305, permitting a further increased density of cells in the integrated semiconductor element. Further, with the gate electrode 307 extending over an exposed surface portion of the n type impurity layer 314 adjacent to the p base region 303, the expansion of the depletion layer is promoted due to a field plate effect upon application of voltage, thus making it possible to achieve an even higher withstand voltage.

Figure 4:
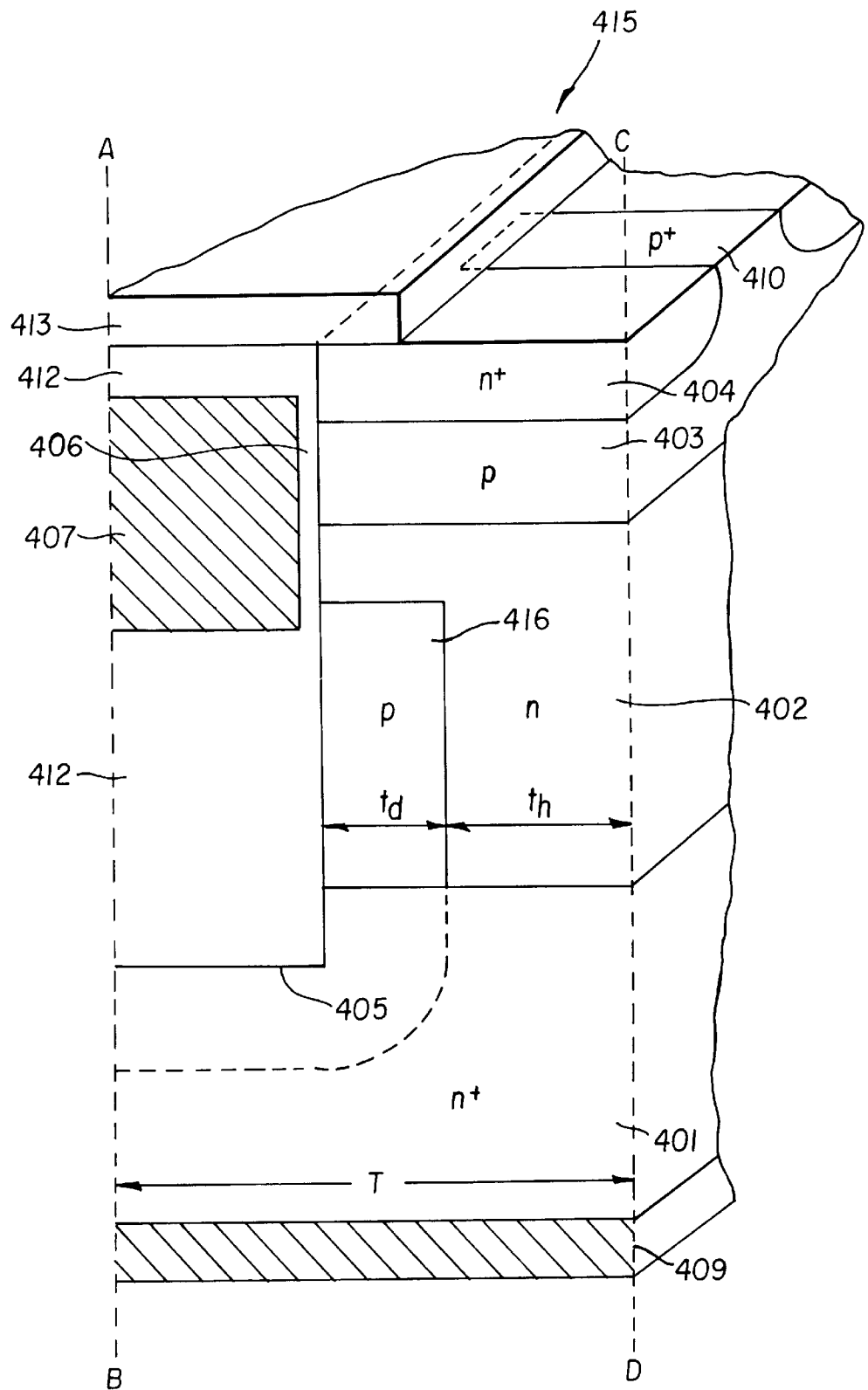
FIG. 4 is a perspective view in cross section, showing a principal part of a vertical trench MOSFET as the fourth embodiment of the present invention.

FIG. 4 is a perspective view in cross section, showing a principal part of a MOSFET according to the fourth embodiment of the present invention, from which a source electrode is removed. In this embodiment, an n type semiconductor layer is epitaxially grown on an n+ substrate 401, to provide an n drain drift region 402. A p base region 403 is formed in a surface layer of the n drain drift layer 402, and an n+ source region 404 is formed in a part of a surface layer of the p base region 403. A trench 405 is formed to extend from the surface of the n+ source region 404 into the n+ substrate 401, and boron ions are obliquely implanted in the lower portion of the inner wall of the trench 405, which is then subjected to heat treatment, to provide a p side wall region 416. An oxide film 412 fills a portion of the trench 405 which extends from the bottom surface thereof up to approximately the same level as the upper end of the p side wall region 416. A gate electrode 407 formed from polycrystalline silicon is provided on the oxide film 412, such that the electrode 407 is opposed to the side face of the p base region 403, through a 50 nm-thickness gate oxide film 406. Another oxide film 412 and an insulating film 413 are deposited on the gate electrode 413. Further, p+ contact regions 410 having a relatively high impurity concentration are formed in portions of the uppermost surface of the semiconductor substrate in which the n+ source region 404 is not formed. A source electrode is formed in contact with both surfaces of the n+ source region 404 and the p+ contact regions 410, and a drain electrode 409 is formed on the rear surface of the n+ substrate 401. The distance (T) between the line A-B and the line C-D, which is a half pitch of a unit cell of this MOSFET, is 2 μm, for example.

In this fourth embodiment, too, a depletion layer fills the n drain drift region 402 and the p side wall region 416, upon application of a voltage lower than the element withstand voltage. As a result, the positive and negative fixed charges in these regions 402, 116 are balanced, to thus reduce the electric field and achieve a sufficiently high withstand voltage. Since the thicknesses "td" and "th" of the n drain drift region 402 and p side wall region 416 are sufficiently small, these regions 402, 416 can be completely depleted even if the impurity concentration is set to as high as $10^{17}$ cm$^{-3}$ or more. This means that the ON-state resistance of the n drain drift region 402 in the unit cell can be reduced, while assuring a sufficiently high withstand voltage.

Figure 5:
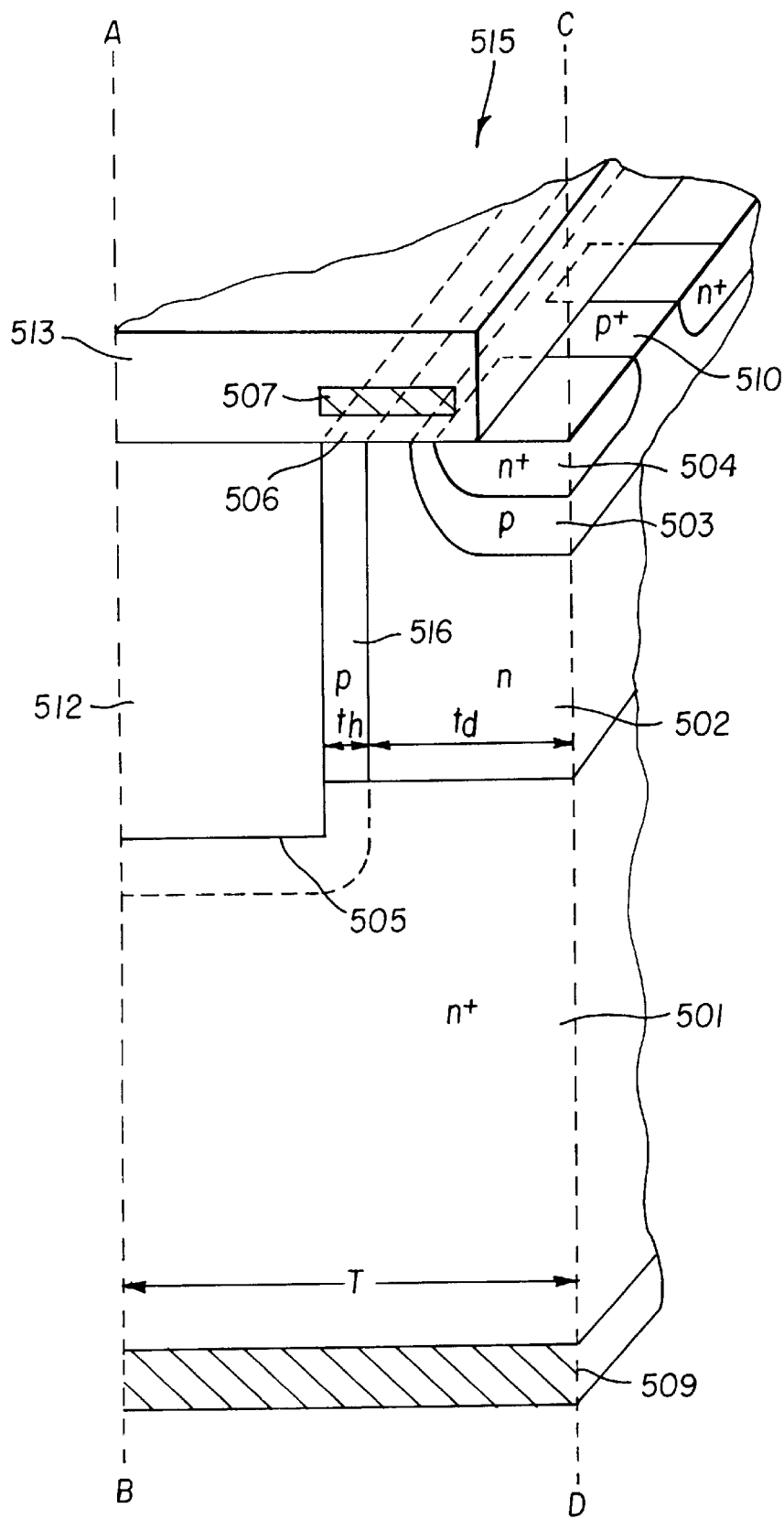
FIG. 5 is a perspective view in cross section, showing a principal part of a vertical trench MOSFET as the fifth embodiment of the present invention.

FIG. 5 is a perspective view in cross section, showing a principal part of a MOSFET according to the fifth embodiment of the present invention. In this embodiment, an n type semiconductor layer is epitaxially grown on an n+ substrate 501, to provide an n drain drift region 502. A trench 505 is formed to extend from the surface of the n drain drift region 502 into the n+ substrate 501, and a p side wall region 516 is formed by obliquely implanting boron ions into the inner wall of the trench 505, and the effecting heat treatment. A p base region 503 is formed in a selected area of the upper surface layer of a top portion 515 that is left after formation of the trench 505, such that the p base region 503 is spaced a small distance apart from the edge of the trench 505, and n+ source regions 504 are formed in parts of a surface layer of the p base region 503. A gate electrode 507 made of polycrystalline silicon is formed on the surface of the p base region 503 interposed between the n+ source region 504 and the n drain drift region 502, through a gate oxide film 506. Further, p+ contact regions 510 having high impurity concentration are formed in portions of the surface layer of the p base region 503 in which the n+ source regions 504 are not formed. A source electrode is formed in contact with both surfaces of the n+ source region 504 and the p+ contact region 510, and a drain electrode 509 is formed on the rear surface of the n+ substrate 501. The distance (T) between the line A-B and the line C-D, which is a half pitch of a unit cell fo this MOSFET, is 2 μm, for example. The trench 505 is filled with an oxide film 512, and the gate electrode 507 may be extended over the oxide film 512, as shown in FIG. 5.

In this fifth embodiment, too, a depletion layer fills the n drain drift region 502 and the p side wall region 516, upon application of a voltage lower than the element withstand voltage. As a result, the positive and negative fixed charges in these regions 502, 516 are balanced, to thus reduce the electric field and achieve a high withstand voltage. Since the thicknesses "td" and "th" of the n drain drift region 502 and p side wall region 516 are sufficiently small, these regions 502, 516 can be completely depleted even if their impurity concentrations are set to as high as $10^{17}$ cm$^{-3}$ or more. This means that the ON-state resistance of the n drain drift region 502 in the unit cell can be reduced, while assuring a sufficiently high withstand voltage.

Figure 6:
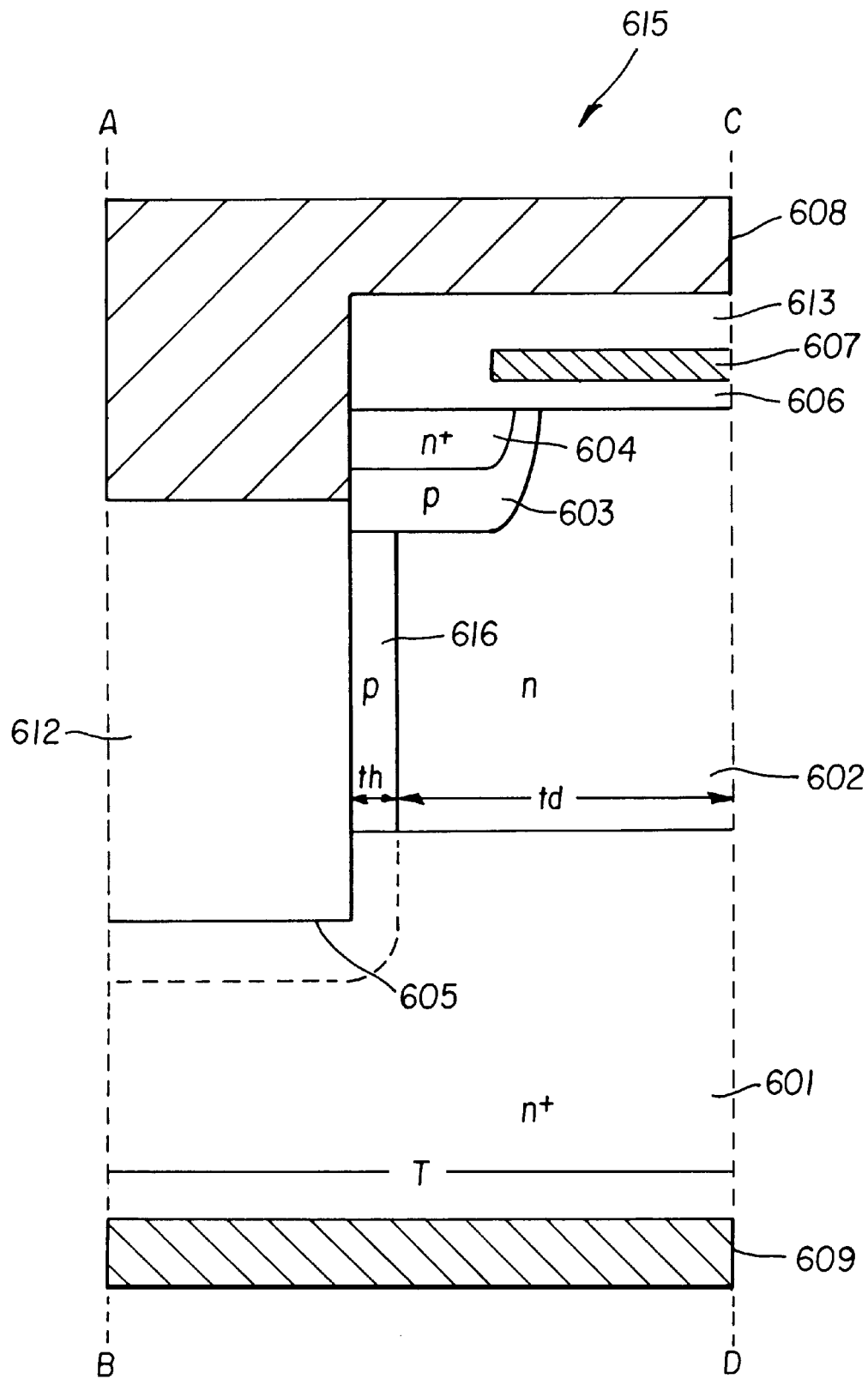
FIG. 6 is a cross sectional view showing a principal part of a vertical trench MOSFET as the sixth embodiment of the present invention.

FIG. 6 is a cross sectional view showing a principal part of a MOSFET according to the sixth embodiment of the present invention. In this embodiment, an n type semiconductor layer is epitaxially grown on an n+ substrate 601, to provide an n drain drift region 602. A p base region 603 is formed in a selected area of a surface layer of the n drain drift region 602, arid an n+ source region 604 is formed in a surface layer of the p base region 603. A trench 605 is formed to extend from the surface of the n+ source region 604 to reach the n+ substrate 601. To form a p side wall region 616, boron ions are obliquely implanted in the inner wall of the trench 605, which is then subjected to heat treatment. A gate electrode made of polycrystalline silicon is formed on the surface of the p base region 603 interposed between the n+ source region 604 and the n drain drift region 602, through a gate oxide film 606. A source electrode 607 is formed in contact with both surfaces of the n+ source region 604 and the p base region 603 which are exposed to the inner wall of the trench 605, and a drain electrode 609 is formed on the rear surface of the n+ substrate 601. The trench 605 is filled with an oxide film 612. The distance (T) between the line A-B and the line C-D, which is a half pitch of a unit cell of this MOSFET, is 2 μm, for example.

In this sixth embodiment, too, a depletion layer fills the n drain drift region 602 and the p side wall region 616, upon application of a voltage lower than the element withstand voltage. As a result, the positive and negative fixed charges in these regions 602, 616 are balanced, to thus reduce the electric field and achieve a high withstand voltage. Since the thicknesses "td" and "th" of the n drain drift region 602 and the p type side wall region 616 are sufficiently small, these regions 602, 616 can be completely depleted even if they have a high impurity concentration of $10^{17}$ cm$^{-3}$ or more. This means that the ON-state resistance of the n drain drift region 602 in the unit cell can be reduced, while assuring a sufficiently high withstand voltage.

In the third embodiment of FIG. 3, in particular, the contact of the source electrode 608 with the n+ source region 604 is made on the inner surface of the trench 605, permitting a further increased density of cells in the integrated semiconductor element. In producing the MOSFET of any of the first through sixth embodiments, the n drain drift region or the p side wall region may be formed in the inner surface of the trench, through a filler filling the interior of the trench, instead of implanting ions into the side wall of the trench and effecting heat treatment. For example, polycrystalline silicon may be used as the filler, and impurities with which the filler is doped may be re-diffused into the side wall of the trench, to form the n drain drift region or p side wall region. In this case, the polycrystalline silicon filling the trench may be removed by etching, or may be oxidized to form an oxide film.

In the illustrated embodiments, it is also possible to change the conductivity type of the semiconductor regions of the MOSFET. Further, the gate insulating film is not limited to an oxide film, and therefore the present invention is also applicable to a MISFET having a MIS (metal-insulator-semiconductor) gate structure.

In the vertical trench MOSFET according to any of the first through third embodiments of the present invention, the first conductivity type drain drift region formed as a surface layer of the side wall of the trench has a relatively small thickness, and an impurity concentration that is higher than a level at which the breakdown voltage measured in a hypothetical diffusion type junction is substantially equal to the withstand voltage of the element. Upon application of voltage lower than the element withstand voltage, therefore, a depletion layer fills the first conductivity type drain drift region and the second conductivity type region, whereby positive and negative fixed charges in these regions are balanced or offset, to thus reduce the electric field and achieve a high withstand voltage. Further, the ON-state resistance of the vertical trench MISFET can be reduced because of the high impurity concentration of the first conductivity type drain drift region.

In the vertical trench MOSFET according to any of the fourth through sixth embodiments of the invention, the second conductivity type side wall region is formed as a surface layer of the side wall of the trench, and the first conductivity type impurity layer has an impurity concentration that is higher than a level at which the breakdown voltage measured in a hypothetical diffusion type junction is substantially equal to the withstand voltage of the element. Upon application of voltage lower than the element withstand voltage, therefore, a depletion layer fills the first conductivity type drain drift region and the second conductivity type side wall region, whereby positive and negative fixed charges in these regions are balanced, to thus reduce the electric field and achieve a high withstand voltage. Further, the ON-state resistance of the vertical trench MISFET can be reduced because of the high impurity concentration of the first conductivity type drain drift region.

With the impurity concentration of the drain drift region thus increased, the ON-state resistance of this region has a reduced temperature dependency, thus limiting an increase in the ON-state resistance of the element at a high temperature.

To achieve a desired the ON-state resistance, the size of the chip can be reduced according to the present invention, with a result of a reduced gate area and a reduce area of each junction, as compared with a conventional counterpart. Consequently, the parasitic capacity and the switching loss of the element can be advantageously reduced. Further, the manufacturing cost can be reduced with the reduction of the chip size.

What is claimed is:

1. A vertical trench MISFET comprising:
   a semiconductor substrate having a first conductivity type semiconductor, and a second conductivity type impurity layer disposed on the first conductivity type semiconductor;
   a trench extending from a surface of said semiconductor substrate to reach said first conductivity type semiconductor;
   a second conductivity type base region formed in a top portion of said semiconductor substrate;
   a first conductivity type source region formed in a part of a surface layer of said second conductivity type base region;
   a first conductivity type drain drift region formed in a surface layer of a side wall of said trench, said first conductivity type drain drift region having a small thickness and first impurity concentration that is higher than a second impurity concentration at which a breakdown voltage measured in a hypothetical diffusion type junction is substantially equal to an element withstand voltage;
   a gate electrode formed on an exposed surface of said second conductivity type base region;
   a gate insulating film provided between said gate electrode and said second conductivity type base region;
   a source electrode disposed in contact with surfaces of both of said first conductivity type source region and said second conductivity type base region; and
   a drain electrode disposed in contact with a rear surface of said first conductivity type semiconductor.

2. A vertical trench MOSFET as defined in claim 1, wherein said first conductivity type drain drift region consists of an impurity diffused layer.

3. A vertical trench MISFET comprising:
   a first conductivity type semiconductor;
   a second conductivity type impurity layer formed on a surface of said first conductivity type semiconductor;
   a second conductivity type base layer formed on said second conductivity type impurity layer and having a higher impurity concentration than the second conductivity type impurity layer;
   a first conductivity type source region formed in a part of a surface layer of said second conductivity type base layer;
   a trench extending from a surface of said first conductivity type source region to reach said first conductivity type semiconductor;
   a first conductivity type drain drift region formed in a surface layer of said second conductivity type impurity layer which is exposed to an inner surface of said trench, said first conductivity type drain drift region having a first impurity concentration that is higher than a second impurity concentration at which a breakdown voltage measured in a hypothetical diffusion type junction is substantially equal to an element withstand voltage;
   a gate electrode disposed in said trench such that the gate electrode faces a surface of said second conductivity type base layer which is exposed to the inner surface of the trench, a portion of said trench other than said gate electrode being filled with an oxide film;
   a gate insulating film provided between said gate electrode and said second conductivity type base layer;
   a source electrode disposed in contact with both of a surface of said first conductivity type source region and an exposed surface portion of said second conductivity type base region; and
   a drain electrode disposed in contact with a rear surface of said first conductivity type semiconductor.

4. A vertical trench MISFET comprising:
   a first conductivity type semiconductor substrate;
   a second conductivity type impurity layer formed on a surface of said first conductivity type semiconductor substrate;

a trench extending from a surface of said second conductivity type impurity layer to reach said first conductivity type semiconductor substrate;

a first conductivity type side wall region formed in a surface layer of said second conductivity type impurity layer which is exposed to an inner surface of said trench, said first conductivity type side wall region having a first impurity concentration that is higher than a second impurity concentration at which a breakdown voltage measured in a hypothetical diffusion type junction is substantially equal to an element withstand voltage;

a second conductivity type base region formed in a surface layer of said second conductivity type impurity layer and a part of a surface layer of said first conductivity type side wall region;

a first conductivity type source region formed in a part of a surface layer of said second conductivity type base region;

a gate electrode formed on a surface of said second conductivity type base region which is interposed between said first conductivity type source region and said first conductivity type side wall region;

a gate insulating film provided between said gate electrode and said second conductivity type base region;

a source electrode disposed in contact with both of a surface of said first conductivity type source region and an exposed surface portion of said second conductivity type base region;

a drain electrode disposed in contact with a rear surface of said first conductivity type semiconductor substrate; and an oxide film filling said trench.

5. A vertical trench MISFET comprising:

a first conductivity type semiconductor substrate;

a second conductivity type impurity layer formed on a surface of said first conductivity type semiconductor substrate;

a first conductivity type impurity layer formed on said second conductivity type impurity layer;

a second conductivity type base region formed in a part of a surface layer of said first conductivity type impurity layer;

a first conductivity type source region formed in a part of a surface layer of said second conductivity type base region;

a trench extending from a surface of said first conductivity type source region to reach said first conductivity type semiconductor substrate;

a first conductivity type side wall region formed in a surface layer of said second conductivity type impurity layer which is exposed to an inner surface of said trench, said first conductivity type side wall region having a first impurity concentration that is higher than a second impurity concentration at which a breakdown voltage measured in a hypothetical diffusion type junction is substantially equal to an element withstand voltage;

a gate electrode formed on a surface of said second conductivity type base region which is interposed between said first conductivity type source region and said first conductivity type impurity layer;

a gate insulating film provided between said gate electrode and said second conductivity type base region;

a source electrode disposed in contact with surfaces of both of said second conductivity type base region and said first conductivity type source region, which surfaces are exposed to an inner surface of said trench;

an oxide film filling a portion of said trench other than said source electrode; and a drain electrode disposed in contact with a rear surface of said first conductivity type semiconductor substrate.

6. A vertical trench MISFET comprising:

a semiconductor substrate having a first conductivity type semiconductor, and a first conductivity type impurity layer provided on the first conductivity type semiconductor, said first conductivity type impurity layer having a first impurity concentration that is higher than a second impurity concentration at which a breakdown voltage measured in a hypothetical diffusion type junction is substantially equal to an element withstand voltage;

a trench extending from a surface of said semiconductor substrate to reach said first conductivity type semiconductor;

a second conductivity type base region formed in a top portion of said semiconductor substrate;

a first conductivity type source region formed in a part of a surface layer of said second conductivity type base region;

a second conductivity type side wall region formed in a surface layer of a side wall of said trench;

a gate electrode formed on an exposed surface of said second conductivity type base region;

a gate insulating film provided between said gate electrode and said second conductivity type base region;

a source electrode disposed in contact with surfaces of both of said first conductivity type source region and said second conductivity type base region; and a drain electrode disposed in contact with a rear surface of said first conductivity type semiconductor.

7. A vertical trench MOSFET as defined in claim 6, wherein said second conductivity type side wall region consists of an impurity diffused layer.

8. A vertical trench MISFET comprising;

a first conductivity type semiconductor;

a first conductivity type drain drift layer formed on a surface of said first conductivity type semiconductor, said first conductivity type drain drift layer having a first impurity concentration that is higher than a second impurity concentration at which a breakdown voltage measured in a hypothetical diffusion type junction is substantially equal to an element withstand voltage;

a second conductivity type base layer formed on said first conductivity type drain drift layer;

a first conductivity type source region formed in a part of a surface layer of said second conductivity type base layer;

a trench extending from a surface of said first conductivity type source region to reach said first conductivity type semiconductor;

a second conductivity type side wall region formed in a surface layer of a lower portion of said first conductivity type drain drift layer which is exposed to an inner surface of said trench, wherein said side wall region extends along a side of said trench to the first conductivity type semiconductor;

a gate electrode disposed in said trench such that the gate electrode faces a surface of an upper portion of said first conductivity type drain drift layer which is exposed to the inner surface of said trench, and a surface of said second conductivity type base layer which is exposed to the inner surface of the trench;

a gate insulating film provided between said gate electrode, and said first conductivity type drain drift layer and said second conductivity type base layer;

an oxide film filling a portion of said trench other than said gate electrode;

a source electrode disposed in contact with both of a surface of said first conductivity source region, and an exposed surface portion of said second conductivity type base layer; and a drain electrode disposed in contact with a rear surface of said first conductivity type semiconductor.

9. A vertical trench MISFET comprising:

a first conductivity type semiconductor;

a first conductivity type impurity layer formed on said first conductivity type semiconductor, said first conductivity type impurity layer having a first impurity concentration that is higher than a second impurity concentration at which a breakdown voltage measured in a hypothetical diffusion type junction is substantially equal to an element withstand voltage;

a second conductivity type base region formed in a part of a surface layer of said first conductivity type impurity layer;

a first conductivity type source region formed in a part of a surface layer of said second conductivity type base region;

a trench extending from a surface of said first conductivity type impurity layer to reach said first conductivity type semiconductor;

a second conductivity type side wall region formed in an exposed surface layer of said first conductivity type impurity layer which is exposed to an inner surface of said trench;

a gate electrode formed on a surface of said second conductivity type base region which is interposed between said first conductivity type source region and said first conductivity type impurity layer;

a gate insulating film provided between said gate electrode and said second conductivity type base region;

a source electrode disposed in contact with both of a surface of said first conductivity type source region, and an exposed surface portion of said second conductivity type base region;

a drain electrode disposed in contact with a rear surface of said first conductivity type semiconductor; and an oxide film filling said trench.

10. A vertical trench MISFET comprising:

a first conductivity type semiconductor;

a first conductivity type impurity layer formed on a surface of said first conductivity type semiconductor, said first conductivity type impurity layer having a first impurity concentration that is higher than a second impurity concentration at which a breakdown voltage measured in a hypothetical diffusion type junction is substantially equal to an element withstand voltage;

a second conductivity type base region formed in a part of a surface layer of said first conductivity type impurity layer;

a first conductivity type source region formed in a part of a surface layer of said second conductivity type base region;

a trench extending from a surface of said first conductivity type source region to reach said first conductivity type semiconductor;

a second conductivity type side wall region formed in a surface layer of said first conductivity type impurity layer which is exposed to an inner surface of said trench;

a gate electrode formed on a surface of said second conductivity type base region interposed between said first conductivity type source region and said first conductivity type impurity layer;

a gate insulating film provided between said gate electrode and said second conductivity type base region;

a source electrode disposed in contact with both surfaces of said second conductivity type base region and said first conductivity type source region, which surfaces are exposed to the inner surface of said trench;

an oxide film filling a portion of said trench other than said source electrode; and a drain electrode disposed in contact with a rear surface of said first conductivity type semiconductor.

* * * * *